(12) United States Patent
Byun et al.

(10) Patent No.: US 11,075,156 B2
(45) Date of Patent: Jul. 27, 2021

(54) SUBSTRATE HAVING ELECTRONIC COMPONENT EMBEDDED THEREIN

(71) Applicant: SAMSUNG ELECTRO-MECHANICS CO., LTD., Suwon-si (KR)

(72) Inventors: Dae Jung Byun, Suwon-si (KR); Yong Duk Lee, Suwon-si (KR); Chang Hwa Park, Suwon-si (KR); Ki Ho Na, Suwon-si (KR); Je Sang Park, Suwon-si (KR); Jin Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 24 days.

(21) Appl. No.: 16/807,473

(22) Filed: Mar. 3, 2020

(65) Prior Publication Data
US 2021/0193563 A1   Jun. 24, 2021

(30) Foreign Application Priority Data
Dec. 19, 2019   (KR) ........................ 10-2019-0170933

(51) Int. Cl.
*H01L 23/495*   (2006.01)
*H01L 23/498*   (2006.01)
(Continued)

(52) U.S. Cl.
CPC .... *H01L 23/49838* (2013.01); *H01L 21/4857* (2013.01); *H01L 21/6835* (2013.01);
(Continued)

(58) Field of Classification Search
CPC . H01L 21/4857; H01L 21/6835; H01L 23/13; H01L 23/49822; H01L 23/49816; H01L 23/49838; H01L 24/19; H01L 24/20
(Continued)

(56) References Cited

U.S. PATENT DOCUMENTS 9,307,632 B2 *  4/2016  Lee ..................... H05K 3/4688
10,453,788 B2 * 10/2019  Lee ......................... H01L 23/13
(Continued)

FOREIGN PATENT DOCUMENTS

JP            6169955 B2    7/2017
KR      10-1019161 B1       3/2011
(Continued)

*Primary Examiner* — Luan C Thai
(74) *Attorney, Agent, or Firm* — Morgan, Lewis & Bockius LLP

(57) ABSTRACT

A substrate having an electronic component embedded therein includes a core structure including a first insulating body and first wiring layers and having a cavity, an electronic component embedded in the cavity, a build-up structure including a second insulating body, covering at least a portion of each of the core structure and the electronic component and filling a portion of the cavity, and second wiring layers, a first passivation layer disposed on a side of the core structure opposing a side of the core structure on which the build-up structure is disposed, and a second passivation layer disposed on a side of the build-up structure opposing a side of the build-up structure on which the core structure is disposed, wherein the first and second passivation layers include different types of materials.

19 Claims, 11 Drawing Sheets

(51) Int. Cl.
  *H01L 23/13*   (2006.01)
  *H01L 23/00*   (2006.01)
  *H01L 21/48*   (2006.01)
  *H01L 21/683*  (2006.01)

(52) U.S. Cl.
  CPC ........ *H01L 23/13* (2013.01); *H01L 23/49816* (2013.01); *H01L 23/49822* (2013.01); *H01L 24/19* (2013.01); *H01L 24/20* (2013.01); *H01L 2221/68345* (2013.01); *H01L 2221/68359* (2013.01)

(58) Field of Classification Search
  USPC ........................................................ 257/668
  See application file for complete search history.

(56) References Cited

U.S. PATENT DOCUMENTS

| | | |
|---|---|---|
| 2010/0148348 A1 | 6/2010 | Lee et al. |
| 2015/0318226 A1 | 11/2015 | Baek et al. |
| 2019/0058241 A1* | 2/2019 | So .......................... H01L 23/66 |
| 2019/0131270 A1 | 5/2019 | Lee et al. |

FOREIGN PATENT DOCUMENTS

| | | |
|---|---|---|
| KR | 10-2015-0126133 A | 11/2015 |
| KR | 10-1963292 B1 | 3/2019 |

* cited by examiner

SUBSTRATE HAVING ELECTRONIC COMPONENT EMBEDDED THEREIN

CROSS-REFERENCE TO RELATED APPLICATION(S)

This application claims the benefit under 35 USC 119 (a) of Korean Patent Application No. 10-2019-0170933 filed on Dec. 19, 2019 in the Korean Intellectual Property Office, the entire disclosure of which is incorporated herein by reference for all purposes.

TECHNICAL FIELD

The present disclosure relates to a substrate having an electronic component embedded therein.

BACKGROUND

With the arrival of the 5th generation (5G) cellular communications era, the number of components mounted on a mainboard of a smartphone has increased. It may also be necessary to secure a space in which components such as an antenna for 5G communications, a baseband modem, and the like, are mounted while maintaining compatibility with 4G communications, LTE communications. Accordingly, reductions in the size of a component through modulating the component in the form of a system-in-package (SiP) has been considered.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a substrate having an electronic component embedded therein which may control warpage even if having an asymmetrical structure.

Another aspect of the present disclosure is to provide a substrate having an electronic component embedded therein which may be modularized and miniaturized in the form of a system-in-package (SiP).

However, the objects of the present disclosure are not limited to the above description, and will be more easily understood in the process of describing specific embodiments of the present disclosure.

According to an aspect of the present disclosure, in a substrate having an asymmetrical structure and having an electronic component embedded therein, a coefficient of thermal expansion (CTE) is balanced by providing upper and lower passivation layers formed of different materials.

According to an aspect of the present disclosure, a modularized structure is implemented by providing a surface-mounted component on a substrate having an electronic component embedded therein.

For example, a substrate having an electronic component embedded therein includes a core structure including a first insulating body and a plurality of first wiring layers, each being disposed on or in the first insulating body, and having a cavity penetrating through a portion of the first insulating body in a direction from a first surface of the first insulating body toward a second surface, opposing the first surface, an electronic component embedded in the cavity, a build-up structure including a second insulating body, covering at least a portion of each of the core structure and the electronic component and filling a portion of the cavity, and one or more second wiring layers, each of the one or more second wiring layers being disposed on or in the second insulating body, a first passivation layer disposed on a side of the core structure opposing a side of the core structure on which the build-up structure is disposed, and a second passivation layer disposed on a side of the build-up structure opposing a side of the build-up structure on which the core structure is disposed, wherein the first and second passivation layers include different types of materials.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, embodiments of the present disclosure n will be described with reference to the accompanying drawings. In the accompanying drawings, shapes, sizes, and the like, of components may be exaggerated or reduced for clarity.

Figure 1:
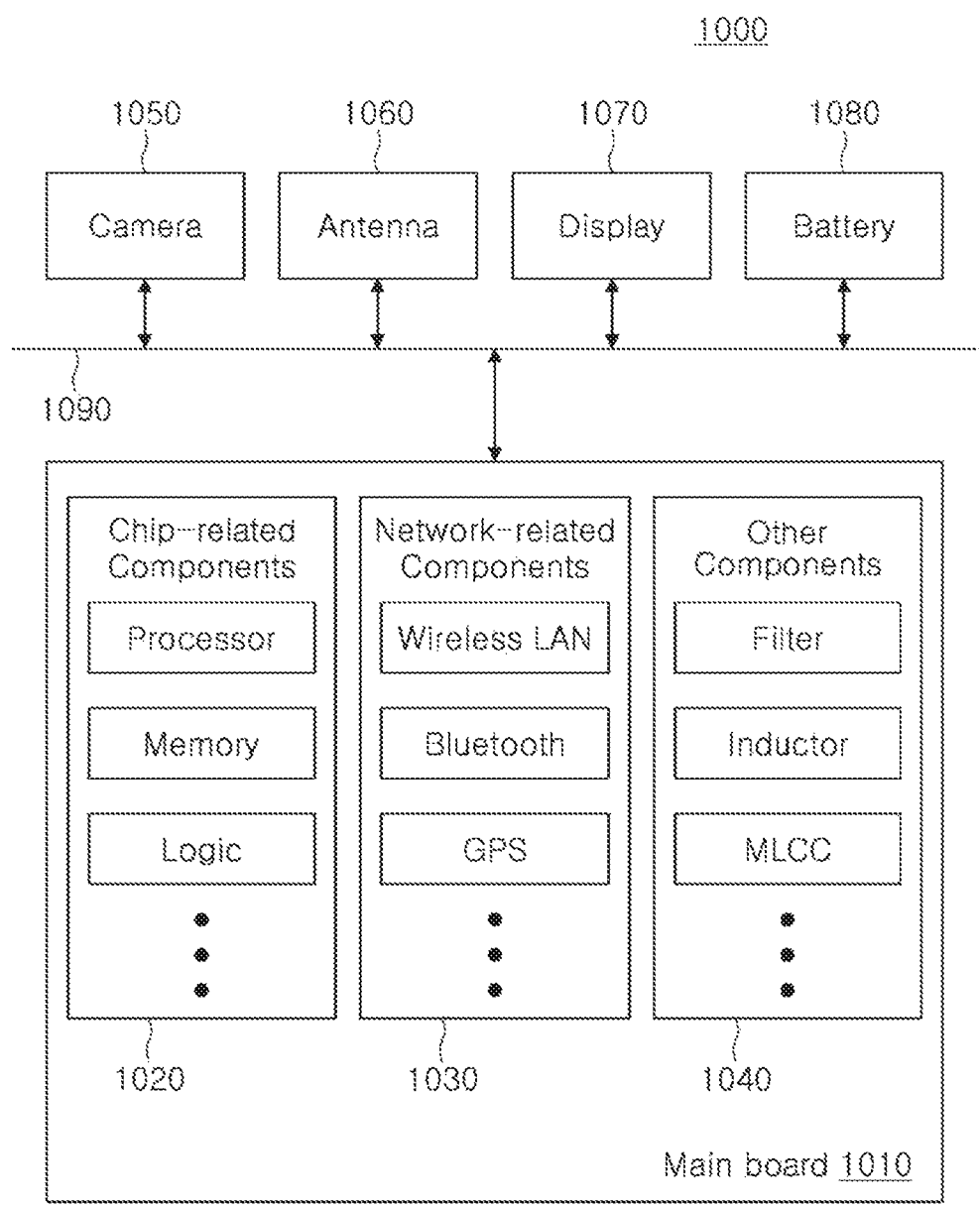
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like, an application processor chip such as a central processor (for example, a central processing unit (CPU)), a graphics processor (for example, a graphics processing unit (GPU)), a digital signal processor, a cryptographic processor, a microprocessor, a microcontroller, or the like, and a logic chip such as an analog-to-digital (ADC) converter, an application-specific integrated circuit (ASIC), or the like. However, the chip-related components 1020 are not limited thereto, but may also include other types of chip related components. In addition, the chip-related components 1020 may be combined with each other. The chip-related components 1020 may be in the form of a package including the above-described chip or electronic component.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access + (HSPA+), high speed downlink packet access + (HSDPA+), high speed uplink packet access + (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with each other, together with the chip-related components 1020.

Other components 1040 may include a high-frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network-related components 1030.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
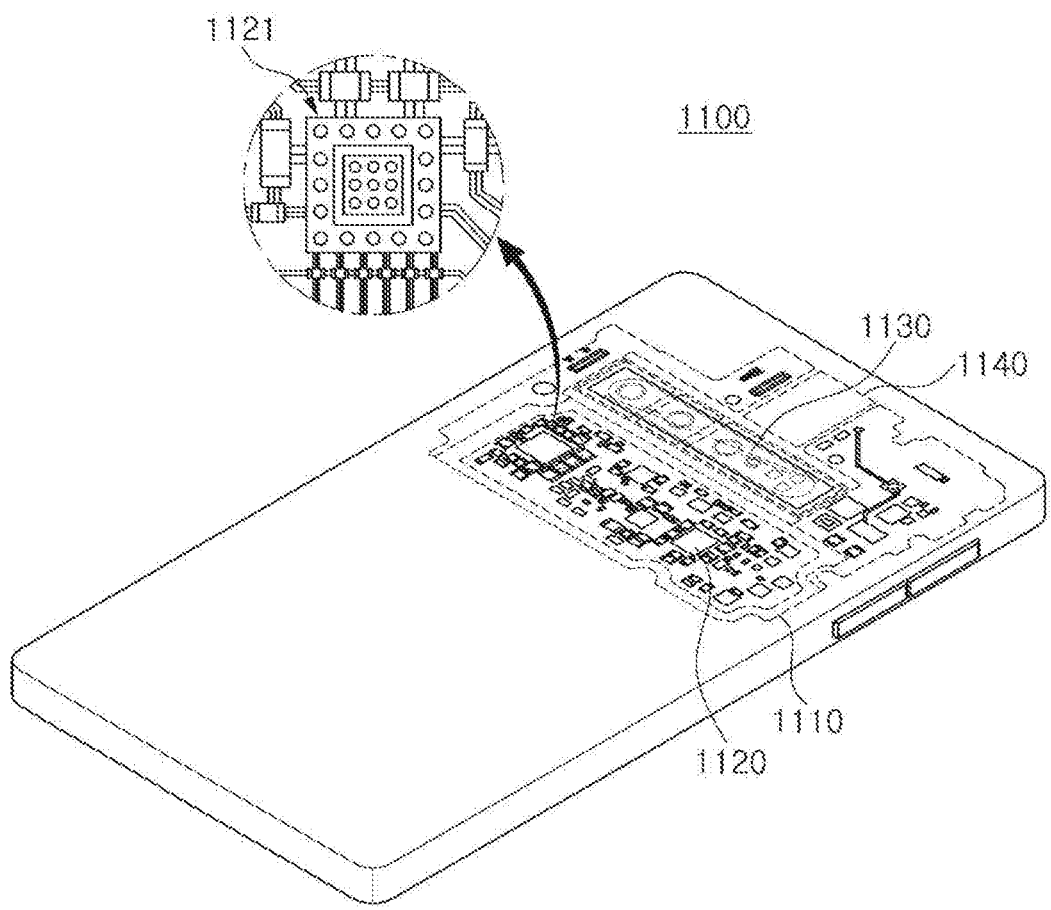
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. The smartphone 1100 may accommodate a mainboard 1110 therein, and various electronic components 1120 may be electrically and/or physically connected to the mainboard 1110. In addition, other components that may or may not be physically or electrically connected to the mainboard 1110, such as a camera module 1130 and/or a speaker 1140, may be accommodated in the mainboard 1110. Some of the electronic components 1120 may be the chip-related components, for example, a semiconductor package 1121, but are not limited thereto.

The electronic device is not necessarily limited to the smartphone 1100, and may be other electronic devices as described above.

Figure 3:
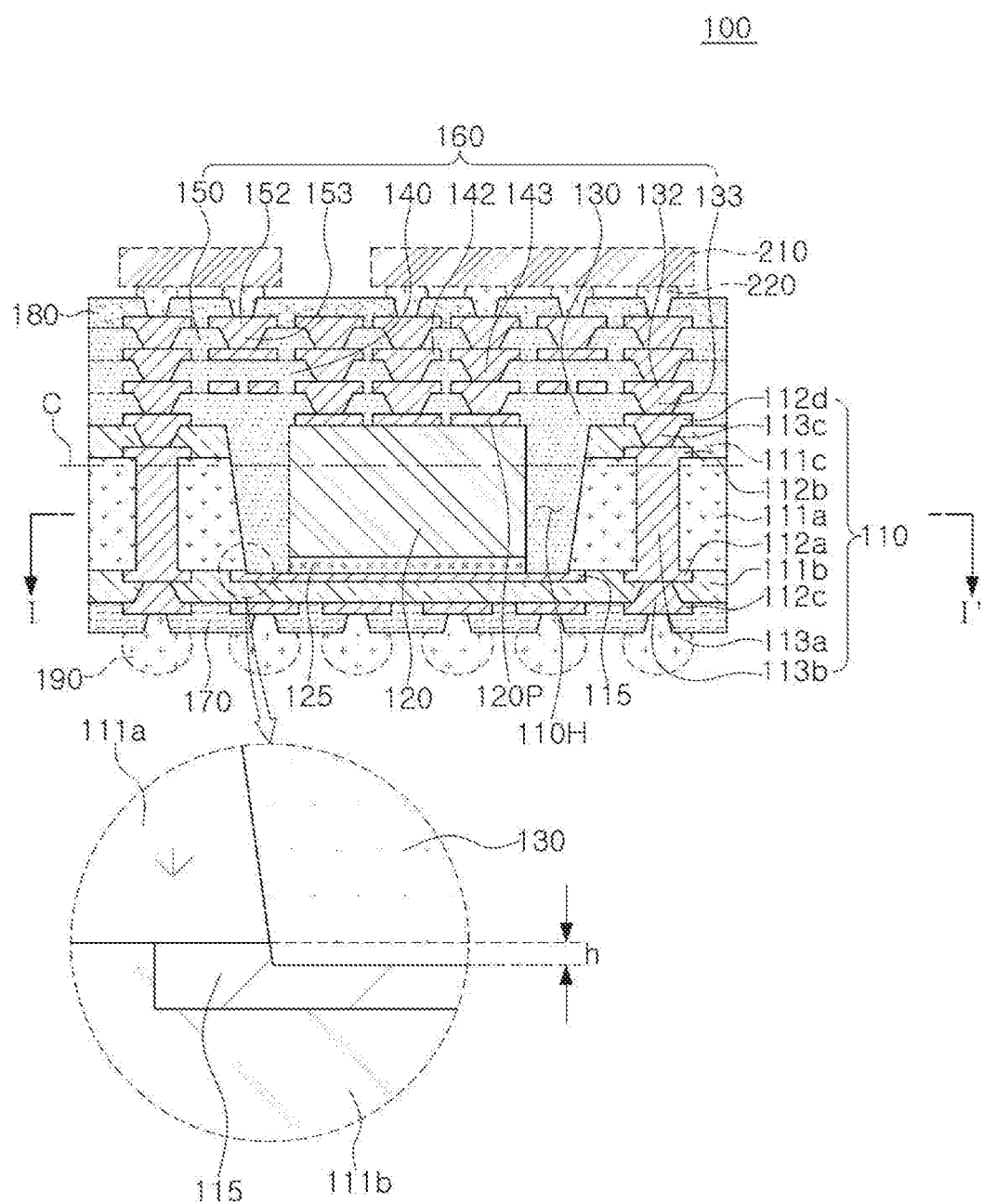
FIG. 3 is a schematic cross-sectional view illustrating an example of a substrate having an electronic component embedded therein.

FIG. 3 is a schematic cross-sectional view illustrating an example of a substrate having an electronic component embedded therein.

Figure 4:
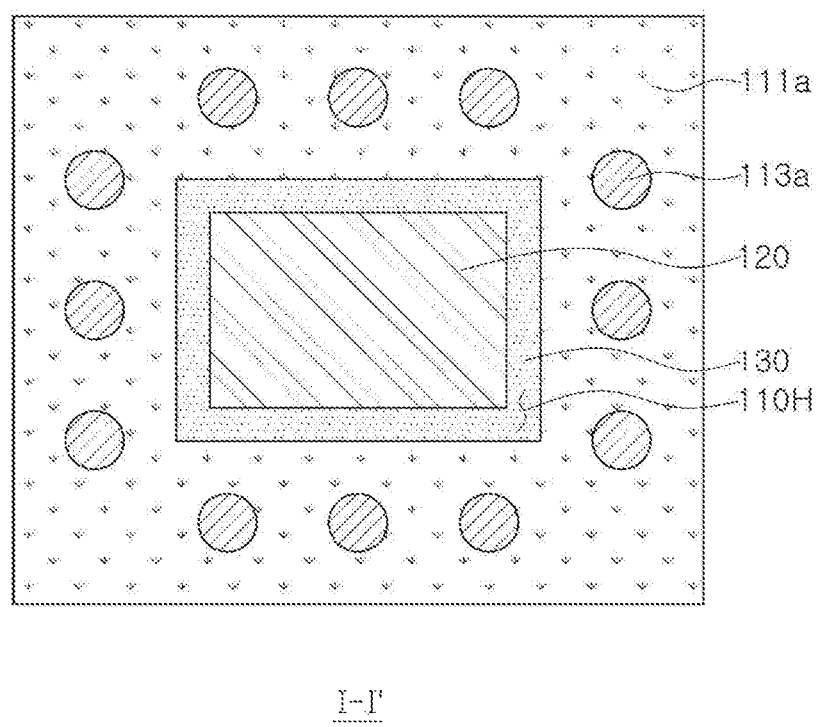
FIG. 4 is a cross-sectional plan view, taken along line I-I' in FIG. 3, illustrating a substrate having an electronic component embedded therein.

FIG. 4 is a cross-sectional plan view, taken along line I-I' in FIG. 3, illustrating a substrate having an electronic component embedded therein.

Referring to FIGS. 3 and 4, a substrate 100 having an electronic component embedded therein includes a core structure 110, an electronic component 120, an insulating material 130, a wiring layer 132, a via layer 133, a build-up structure 160, a first passivation layer 170, and the second passivation layer 180. The core structure 110 includes first insulating bodies 111a, 111b, and 111c, a plurality of core wiring layers 112a, 112b, 112c, and 112d, respectively disposed on or in first insulating bodies 111a, 111b, and 111c, and a plurality of core via layers 113a, 113b, and 113c disposed in the first insulating bodies 111a, 111b and 111c. The core structure 110 has a cavity 110H penetrating through portions 111a and 111c in a direction from upper surfaces toward lower surfaces of the first insulating bodies 111a, 111b and 111c. The electronic component 120 is disposed in the cavity 110H in face-up form, for example. The build-up structure 160 may include second insulating bodies 140 and 150, one or more build-up wiring layers 142 and 152, respectively disposed on or in the second insulating bodies 142 and 152, and one or more via layers 143 and 153 disposed in the second insulating bodies 140 and 150. On the other hand, the material of the first insulating body 111a, 111b, and 111c has a lower thermal expansion coefficient than the material of the second insulating body 140 and 150. In addition, a material of the insulating material 130 has a coefficient of thermal expansion (CTE) lower than a CTE of a material of the second insulating bodies 140 and 150. The coefficient of thermal expansion (CTE), as an average value measured at glass transition temperature (Tg) or less on an X-Y basis, may have a unit of ppm/° C. and may be measured by a thermomechanical analyzer (TMA).

Recently, there has been demand for a technology to embed active components and/or passive components in a substrate. In a structure of a substrate having a component embedded therein, warpage is controlled more easily in a symmetric structure than in an asymmetrical structure. However, the asymmetrical structure is required to sufficiently secure a thickness of an electronic component while removing unnecessary layers. In this case, it is difficult to control warpage in a unit and a strip unit of a substrate. For example, smile-shaped warpage may occur in a face-up arrangement of electronic components. In the recent trend in which an area occupied by electronic components is increasing as compared with an overall size of a package, a warpage effect of the electronic components is reflected on the substrate, and thus, an issue on warpage control has further occurred.

On the other hand, the first and second passivation layers 170 and 180, respectively disposed on an upper side and a lower side of the substrate 100 having an electronic component embedded therein, may be formed of different materials to improve a warpage-related property, for example, balance of a coefficient of thermal expansion (CTE). Therefore, a warpage deviation, caused by an asymmetrical structure, may be addressed to be more effective in warpage control in units and strip units of the substrate 100. For example, a material of the first insulating bodies 111a, 111b, and 111c of the core structure 110 may have a lower CTE than a material of the second insulating bodies 130, 140, and 150 of the build-up structure 160. In this case, the upper side of the substrate may have a higher CTE than the lower side thereof. In addition, when the electronic component 120 includes an active component, for example, a silicon die, a material of a body of the silicon die may have a lower CTE than an organic material of the second insulating bodies 130, 140, and 150. Even in this case, the upper side of the substrate may have a higher CTE the lower side thereof. Therefore, CTE balance may be achieved by providing the first passivation layer 170, having a relatively higher CTE, on the lower side of the substrate 100 and the second passivation layer 180, having a relatively lower CTE on the upper side of the substrate 100. As a result, warpage control in units and strip units of the substrate may be more easily performed.

Hereinafter, elements included in the substrate 100 having an electronic component embedded therein will be described in further detail.

The core structure 110 includes a first core insulating layer 111a, a first core wiring layer 112a disposed on a lower side of the first core insulating layer 111a, a second core wiring layer 112b disposed on an upper side of the first core insulating layer 111a, a second core insulating layer 111b disposed on the lower side of the first core insulating layer 111a and covering at least a portion of the first core wiring layer 112a, a third core wiring layer 112c disposed on a lower side of the second core insulating layer 111b, a third core insulating layer 111c disposed on the upper side of the first core insulating layer 111a and covering at least a portion of the second core wiring layer 112b, and a fourth core wiring layer 112d disposed on an upper side of the third core insulating layer 111c. The core structure 110 further includes a first core via layer 113a penetrating through the first core insulating layer 111a and connecting the first and second core wiring layers 112a and 112b to each other, a second core via layer 113b penetrating through the second core insulating layer 111b and connecting the first and third core wiring layers 112a and 112c to each other, and a third core via layer 113a penetrating through the third core insulating layer 111c and connecting the second and fourth core wiring layers 112b and 112d.

The core structure 110 may further improve rigidity of the substrate 100 having an electronic component embedded therein, depending on a specific material, and may serve to ensure thickness uniformity of a first build-up insulating layer 130. In addition, since the core structure 110 includes the first to fourth core wiring layers 112a, 112b, 112c, and 112d and the first to third core via layers 113a, 113b and 113c, various circuits may be designed and upper and lower electrical connection paths may be provided. In addition, since the core structure 110 includes the third core wiring layer 112c disposed on a level lower than a rear surface of the electronic component 120, a backside wiring layer may easily be provided. The core structure 110 may include more layers than those illustrated in the drawings. Since the number of the core wiring layers 112a, 112b, 112c, and 112d of the core structure 110 may be greater than the number of the build-up wiring layers 132, 142, and 152 of the build-up structure 160, a center of the substrate 100 may be disposed on and the core structure 110. For example, a center line C of the substrate 100 having an electronic component embedded therein may be disposed on a level between upper and lower surfaces of the first insulating bodies 111a, 111b, and 111c, based on a thickness direction. In such an asymmetrical structure, the first and second passivation layers 170 and 180 may be formed of different materials, and thus, CTE adjustment may be performed to be more effective in warpage control.

The core structure 110 has a cavity 110H. A stopper layer 115 may be disposed on a bottom surface of the cavity 110H. The cavity 110H may have a blind form which penetrates through the first core insulating layer 111a and the third core insulating layer 111c, but does not penetrate through the second core insulating layer 111b. The cavity 110H may have a tapered profile in which a width of a cross section is decreased in a direction from an upper side toward a lower side, but a profile of the cavity 110H is not limited thereto.

A material of the first core insulating layer 111a may be an insulating material. The insulating material may an insulating material of a copper clad laminate (CCL). A material of each of the second and third core insulating layers 111b and 111c may also be an insulating material. In this case, the insulating material may an insulating material of resin-coated copper (RCC), but is not limited thereto. Apart from this, a material of each of the first to third core insulating layers 111a, 111b, and 111c may be a thermosetting resin such as an epoxy resin, a thermoplastic resin such as a polyimide resin, an insulating material in which the thermosetting resin or the thermoplastic resin is impregnated in a core material with an inorganic filler and/or a glass fiber, such as prepreg, or the like. When a material having high stiffness, such as prepreg including glass fiber, warpage may be effectively controlled. The second and third core insulating layers 111b and 111c may include the same type of material. The first core insulating layer 111a may have a thickness greater than a thickness of each of the second and third core insulating layers 111b and 111c.

Each of the first to fourth core wiring layers 112a, 112b, 112c, and 112d may include a metal material such as copper (Cu), aluminum (Al), silver (Ag), tin (Sn), gold (Au), nickel (Ni), lead (Pb), titanium (Ti), or alloys thereof. Each of the first to fourth core wiring layers 112a, 112b, 112c, and 112d may perform various functions depending on a design. For example, each of the first to fourth core wiring layers 112a, 112b, 112c, and 112d may include a ground (GND) pattern, a power (PWR) pattern, a signal (S) pattern, and the like. The signal (S) pattern may include various signals other than a ground (GND) pattern, a power (PWR) pattern, and the like, for example, a data signal, and the like. Each of the above patterns may have a linear shape, a planar shape, or a pad shape. The first to fourth core wiring layers 112a, 112b, 112c, and 112d may be formed through a process such as an additive process (AP), a semi-AP (SAP) process, a modified SAP (MSAP) process, a tenting (TT) process, or the like. As a result, each of the first to fourth core wiring layers 112a, 112b, 112c, and 112d may include a seed layer, an electroless plating layer, and an electrolytic plating layer formed based on the seed layer. Each of the first to fourth core wiring layers 112a, 112b, 112c, and 112d may include a copper foil as a lowermost layer. The first and second core wiring layers 112a and 112b may be formed based on a CCL, and may have a copper foil layer as a lowermost layer.

The first to third core via layers 113a, 113b, and 113c respectively penetrate through the first to third core insulating layers 111a, 111b, and 111c, and vertically connect the first to fourth core via layers 112a, 112b, 112c, and 112d. The first to third core via layers 113a, 113b, and 113c may also include a metal material such as copper (Cu), aluminum (Al), silver (Ag), tin (Sn), gold (Au), nickel (Ni), lead (Pb), titanium (Ti), or alloys thereof. Each of the first to third core via layers 113a, 113b, and 113c may have a via for a signal, a via for grounding, a via for power, and the like, depending on a design. Connection vias of the first to third core via layers 113a, 113b, and 113c may be entirely filled with metal materials, or metal materials may be formed along a wall surface of a via hole. The first core via layer 113a may have an hourglass or cylindrical shape. The second and third core via layers 113b and 113c may have profiles tapered in directions opposing each other with the first core via layer 113a interposed therebetween. The first to third core via layers 113a, 113b, and 113c may also be formed by a plating process, for example, an AP, an SAP, an MSAP, a TT, or the like. As a result, each of the first to third core via layers 113a, 113b, and 113c may include a seed layer, an electroless plating layer, and an electrolytic plating layer formed based on the seed layer. The first core via layer 113a may be formed based on a CCL, and may have a copper foil layer as a lowermost layer. A connection via of the first core via layer 113a may be integrated with the pad patterns of the first and second core wiring layers 112a and 112b without boundaries. A connection via of each of the second and third core via layers 113b and 113c may be integrated with a pad pattern of each of the second and third core via layers 113b and 113c without boundaries with a pad patterns of each of the third and fourth core wiring layers 112c and 112d.

The stopper layer 115 may be disposed on a lower surface of the first core insulating layer 111a and may covered with the second core insulating layer 111b. The stopper layer 115 may be formed with the same plating process as the first core wiring layer 112a, for example, an AP, an SAP, an MSAP, a TT, or the like. As a result, the stopper layer 115 may include a seed layer, which are electroless plating layers, and an electroplating layer formed based on the seed layer. The stopper layer 115 may further include a copper foil as a lowermost layer. The stopper layer 115 may be formed in the same plating process as the first core wiring layer 112a simultaneously with the first core wiring layer 112a, and thus, may be disposed on the same level as the first core wiring layer 112a and may include the same metal material such as copper (Cu), aluminum (Al), silver (Ag), tin (Sn), gold (Au), nickel (Ni), lead (Pb), titanium (Ti), or alloys thereof. The stopper layer 115 may have a central region, exposed from the first core insulating layer 111a by the cavity 110H, and an edge region surrounding the central region and covered with the first core insulating layer 111a. A portion of the central region may be removed during formation of the cavity 110H, and the central region may have a thickness less than a thickness of the edge region. For example, the central region and the edge region may have a step h.

The electronic component 120 is disposed in the cavity 110H. A rear surface of the electronic component 120 may be attached to the stopper layer 115 through a known adhesive 125 such as a die attach film (DAF). The electronic component 120 may be configured as an IC in which several hundred to several million or more devices are integrated in a single chip. For example, the electronic component 120 may be implemented by a processor chip such as a central processing unit (CPU), a graphics processor (GPU), a field programmable gate array (FPGA), an application processor (AP), a digital signal processor, a cryptographic processor, a microprocessor, a microcontroller, and the like, an application processor (AP), for example, but an example embodiment thereof is not limited thereto. The electronic component 120 may also be implemented by a memory such as a volatile memory (for example, a DRAM), a nonvolatile memory (for example, a ROM or a flash memory), or the like, or a logic such as an application-specific IC (ASIC), or the like. The electronic component 120 may also be configured as a chip-type passive component.

The electronic component 120 may be formed based on an active wafer. A base material of a body of the electronic component 120 may be silicon (Si), germanium (Ge), gallium arsenide (GaAs), or the like. Various circuits may be disposed in the body. A connection pad 120P may be disposed on an active surface of the body. The connection pad 120P may be configured to electrically connect the electronic component 120 to the other elements, and a conductive material such as copper (Cu), aluminum (Al), or the like, may be used as a material of the electronic component 120. A passivation layer may be disposed on an active surface of the body to cover at least a portion of the connection pad 120P and to expose at least a portion of the connection pad 120P. The passivation layer may be configured as an oxide layer or a nitride layer, or may be configured as a double layer including an oxide layer and a nitride layer. An insulating layer, and the like, may further be disposed in a desired location. The electronic component 120 may be configured as a bare die, but an example thereof is not limited thereto. The electronic component 120 may also be configured as a packaged die.

The build-up structure 160 includes a first build-up structure 130 covering at least a portion of each of the core structure 110 and the electronic component 120 and filling at least a portion of the cavity 110H, a first build-up wiring layer 132 disposed on the first build-up insulating layer 130, a second build-up insulation layer 140 disposed on the first build-up insulating layer 130 and covering at least a portion of the first build-up wiring layer 132, a third build-up insulating layer 150 disposed on the second build-up insulation layer 140 and covering at least a portion of the second build-up wiring layer 142, and a third build-up insulating layer 150 disposed on the second build-up insulating layer 140 and covering at least a portion of the second build-up wiring layer 142. The build-up structure 160 further include a first build-up via layer 133 penetrating through the first build-up insulating layer 130 and connecting the first build-up wiring layer 132 to the connection pad 120P and the fourth core wiring layer 112d, a second build-up via layer 143 penetrating through the second build-up insulating layer 140 and connecting the first and second build-up wiring layers 132 and 142, and a third build-up via layer 153 penetrating through the third build-up insulating layer 150 and connecting the second and third build-up wiring layers 142 and 152.

The build-up structure 160 allows more wirings to be designed in an upward direction. The build-up structure 160 includes first to third build-up wiring layers 132, 142, and 152 and first to third build-up via layers 133, 143, and 153, allowing various circuits to be designs and providing a vertical electrical connection path. The build-up structure 160 may include more layers than those illustrated in the drawings. However, the number of layers is not limited thereto, but the build-up structure may include fewer layers than those illustrated in the drawings.

The first to third build-up insulating layers 130, 140, and 150 may be sequentially laminated on the core structure 110 and the electronic component 120. The first build-up insulating layer 130 may cover at least a portion of each of the core structure 110 and the electronic component 120. In addition, the first build-up insulating layer 130 may fill at least a portion of the cavity 110H. A material of the first to third build-up insulating layers 130, 140, and 150 is not necessarily limited. For example, the material of the first to third build-up insulating layers 130, 140, and 150 may be an insulating material. The insulating material may be a thermosetting resin such as an epoxy resin, a thermoplastic resin such as polyimide, or a resin in which these resins are mixed with an inorganic filler, for example, an Ajinomoto Build-up Film (ABF), or the like. The first and second build-up insulating layers 130, 140, and 150 may include the same type of material. The first and second build-up insulating layers 130, 140, and 150 may be cured and then integrated with each other so that boundaries therebetween may not be readily apparent.

Each of the first to third build-up wiring layers 132, 142, and 152 may include a metal material such as copper (Cu), aluminum (Al), silver (Ag), tin (Sn), gold (Au), nickel (Ni), lead (Pb), titanium (Ti), or alloys thereof. The first to third wiring layers 132, 142, and 152 may perform various functions depending on a design. For example, the first to third build-up wiring layers 132, 142, and 152 may include a ground (GND) pattern, a power (PWR) pattern, a signal (S) pattern, and the like. The signal (S) pattern may include various signals other than a ground (GND) pattern, a power (PWR) pattern, and the like, for example, a data signal, and the like. Each of the patterns may have a linear shape, a planar shape, or a pad shape. The first to third build-up wiring layers 132, 142, and 152 may be formed through a process such as an AP, an SAP, a MSAP, a TT, or the like. The first to third build-up wiring layers 132, 142, and 152 may include a seed layer, an electroless plating layer, and an electrolytic plating layer formed based on the seed layer. The first to third build-up wiring layers 132, 142, and 152 may further include a copper foil as a lowermost layer.

The first to third build-up via layers 133, 143, and 153 penetrate through the first to third build-up insulating layers 130, 140, and 150, respectively. The first build-up via layer 133 connects the first build-up wiring layer 132 to the connection pad 120P of the electronic component 120. In addition, the first build-up via layer 133 connects the first build-up wiring layer 132 to the fourth core wiring layer 112d. The second and third build-up via layers 143 and 153 vertically connect the first to third build-up wiring layers 132, 142, and 152. The first to third build-up via layers 133, 143, and 153 may also include a metal material such as copper (Cu), aluminum (Al), silver (Ag), tin (Sn), gold (Au), nickel (Ni), lead (Pb), titanium (Ti), or alloys thereof. Each of the first to third build-up via layers 133, 143, and 153 may also have a via for a signal, a via for grounding, a via for power, and the like, depending on a design. The first to third build-up via layers 133, 143, and 153 may be entirely filled with metal materials, or a metal materials may be formed along a wall surface of a via hole. The first to third build-up via layers 133, 143, and 153 may have profiles tapered in the same direction. For example, an upper side may have a width greater than a width of a lower side, when viewed in cross section. The first to third build-up via layers 133, 143, and 153 may also be formed by a plating process, such as an AP, an SAP, an MSAP, a TT, or the like, and may include a seed layer, an electroless plating layer, and an electrolytic plating layer formed based on the seed layer. The connection via of each of the first to third build-up via layers 133, 143, and 153 may be integrated with the pad pattern of each of the first to third build-up wiring layers 132, 142, and 152 without boundaries.

The first passivation layer 170 may protect the third wiring layer 112c from external physical and chemical damages. The first passivation layer 170 may be disposed on a lower surface of the second core insulating layer 111b and may cover at least a portion of the third core wiring layer 112c, and may have a plurality of first openings, each exposing at least a portion of the third core wiring layer 112c. A material of the first passivation layer 170 is not necessarily limited. For example, an insulating material may be used as a material of the first passivation layer 170. The insulating material may be a thermosetting resin such as an epoxy resin, a thermoplastic resin such as a polyimide resin, an insulating material in which the thermosetting resin or the thermoplastic resin is mixed with an inorganic filler or is impregnated in a core material with inorganic filler with a glass fiber, such as an Ajinomoto Build-up Film (ABF), but is not limited thereto. The first passivation layer 170 may include a material different from a material of the second passivation layer 180. For example, the material of the first passivation layer 170 may have a higher coefficient of thermal expansion (CTE).

The second passivation layer 180 may protect the third build-up wiring layer 152 from external physical and chemical damages. The second passivation layer 180 may be disposed on an upper surface of the third build-up insulating layer 150 to cover at least a portion of the third build-up wiring layer 152, and may have a plurality of second openings, each exposing at least a portion of the third build-up wiring layer 152. A material of the second passivation layer 180 is not necessarily limited. For example, an insulating material may be used as the material of the second passivation layer 180. The insulating material may be a photosensitive insulating material, for example, a solder resist (SR), but is not limited thereto. The second passivation layer 180 may include a material different from the material of the first passivation layer 170 and, for example, may have a lower coefficient of thermal expansion (CTE) than the first passivation layer 170.

First electrical connection metal bumps 190 are disposed on the first openings of the first passivation layers 170, respectively. The first electrical connection metal bumps 190 are connected to the exposed third core wiring layers 112c, respectively. The first electrical connection metal bump 190 physically and/or electrically connects the substrate 100, having an electronic component embedded therein, to an external entity. For example, the substrate 100 having an electronic component embedded therein may be mounted on a mainboard of an electronic device, a ball grid array (BGA), or the like, through the electrical connection metal bumps 160. For example, the electrical connection metal bump 190 may be formed of tin (Sn), or an alloy including tin (Sn), such as a solder. However, this is merely exemplary and a material of the electrical connection metal bump 190 is not limited thereto. The electrical connection metal bump 190 may be a land, a ball, a pin, or the like. The electrical connection metal bump 190 may include multiple layers or a single layer. When the electrical connection metal bump 190 includes multiple layers, the electrical connection metal bump 190 may include a copper pillar or a solder. When the electrical connection metal bump 190 includes a single layer, the electrical connection metal bump 190 may include a tin-silver solder or copper. However, this is also merely exemplary and an example of the electrical connection metal bump 190 is not limited thereto. The number of the electrical connection metal bump 190, a gap between the electrical connection metal bumps 190, and an arrangement form of the electrical connection metal bumps 160 are not necessarily and may vary depending on a design. As necessary, an under-bump metal (UBM) may be disposed on each of the plurality of first openings, and the first electrical connection metal bumps 190 may be connected to the under-bump metals, respectively.

Surface-mounted components 210 may be further disposed on the second passivation layer 180. The surface-mounted components 210 may be surface-mounted on the second passivation layer 180 through the second electrical connection metal bumps 220, respectively. The surface-mounted components 210 may be active components and/or passive components. An example of active components may be an IC described above with respect to the electric component 120. An example of passive components may be a chip-type capacitor such as a multilayer ceramic capacitor (MLCC), a chip-type inductor such as a power inductor (PI), and the like. Second electrical connection metal bumps 220 may each include tin (Sn) or an alloy including tin (Sn), for example, a solder or the like. As necessary, a molding material may be further disposed on the second passivation layer 180 to cover the surface-mounted component 210. The molding material may be a known epoxy molding compound (EMC), but is not limited thereto. When the surface-mounted component 210 is further disposed, the substrate 100 having an electronic component embedded therein may be used as an SiP.

The substrate 100 having an electronic component embedded therein according to an example may have a plurality of cavities 110H. The above-described stopper layer 115 may be applied to each of the cavities 110H. The same or different electronic components may be disposed in each of the cavities 110H.

FIGS. 5 to 11 are process diagrams illustrating an example of manufacturing a substrate having an electronic component embedded therein illustrated in FIG. 3.

Figure 5:
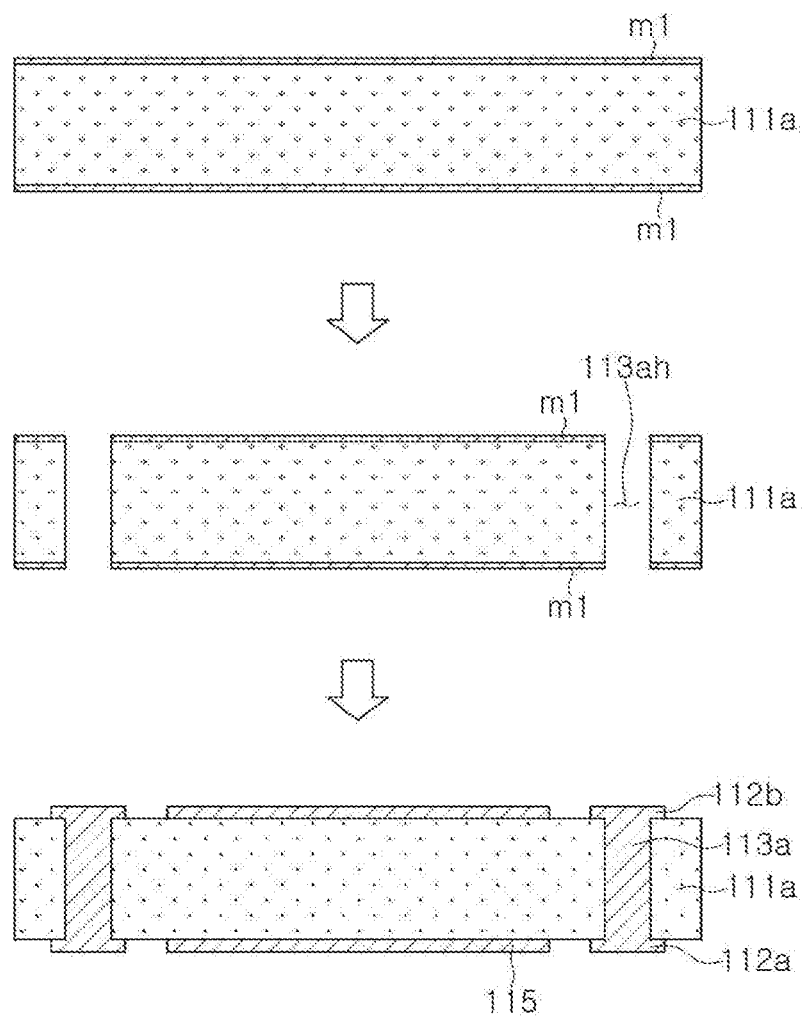
FIGS. 5 to 11 are process diagrams illustrating an example of manufacturing a substrate having an electronic component embedded therein illustrated in FIG. 3.

Referring to FIG. 5, a CCL or the like, used as the first core insulating layer 111a, is prepared. The CCL may have a structure in which a copper foil m1 is laminated on the upper and lower surfaces of the insulating material. A via hole 113a h is formed in the CCL using mechanical drilling or the like. The first and second core wiring layers 112a and 112b and the first core via layer 113a are formed by a plating process. In addition, a stopper layer 115 is formed.

Figure 6:
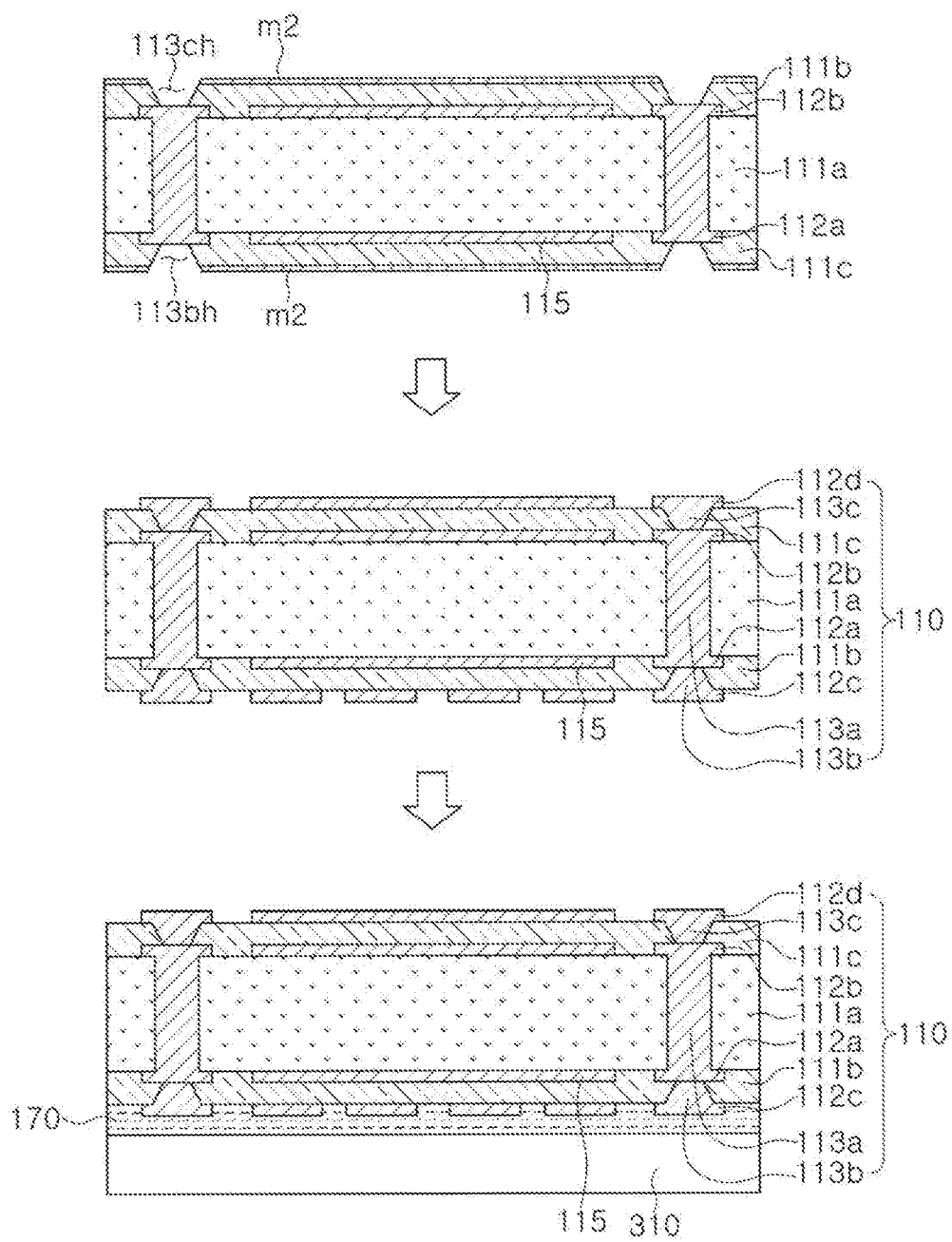

Referring to FIG. 6, the second and third core insulating layers 111b and 111c are formed by laminating prepregs on the upper and lower sides of the first core insulating layer 111a using an RCC or the like. The RCC may have a structure in which a copper foil m2 is laminated on the insulating material. In addition, via holes 113bh and 113ch are formed by laser processing or the like. The third and fourth core wiring layers 112c and 112d and the second and third core via layers 113b and 113c are formed by the plating process. A detach carrier film 310 is attached to the lower side of the core structure 110, manufactured through a series of processes, with the first passivation layer 170 such as an ABF interposed therebetween.

Figure 7:
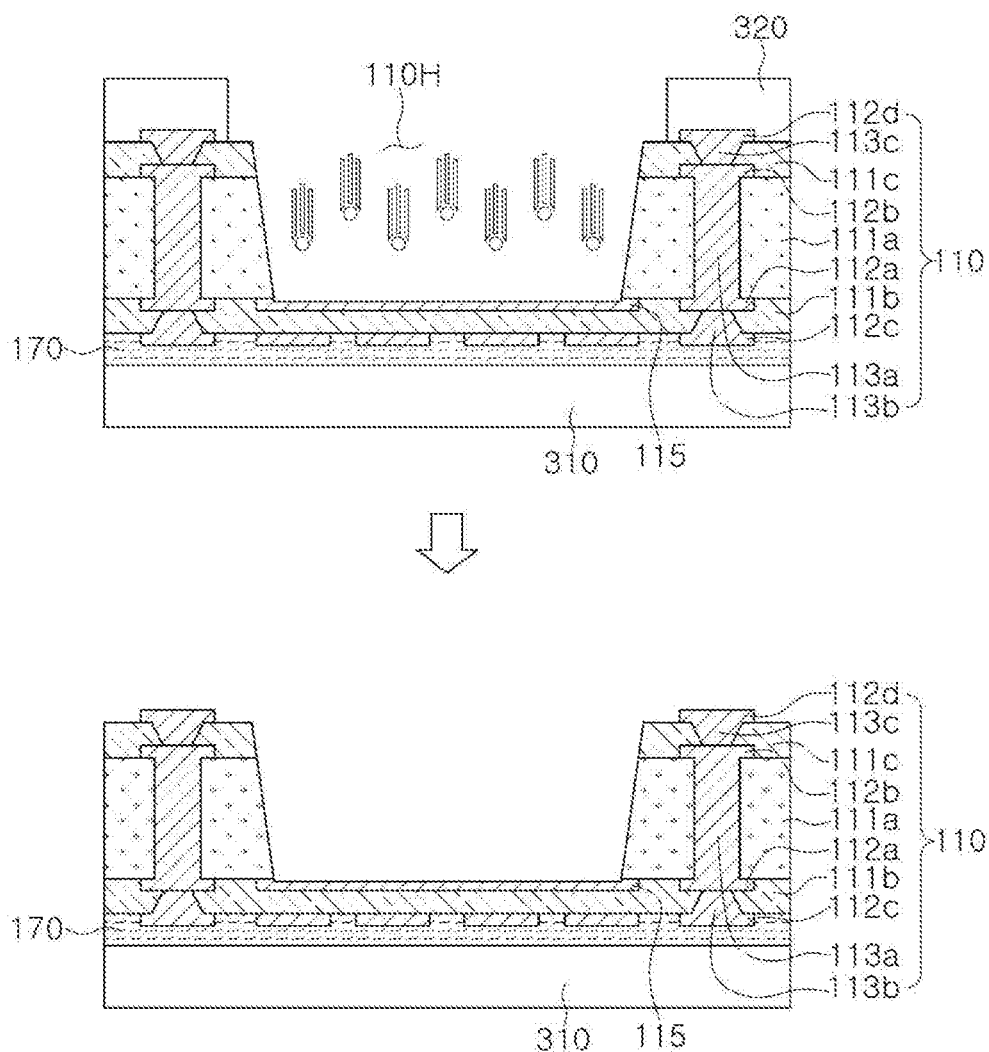

Referring to FIG. 7, a patterned dry film 320 is attached to the upper side of the core structure 110, and a cavity 110H having a depth to the stopper layer 115 is formed by a process in which a core insulating layer is removed by metal etching or sandblasting. The dry film 320 is then removed.

Figure 8:
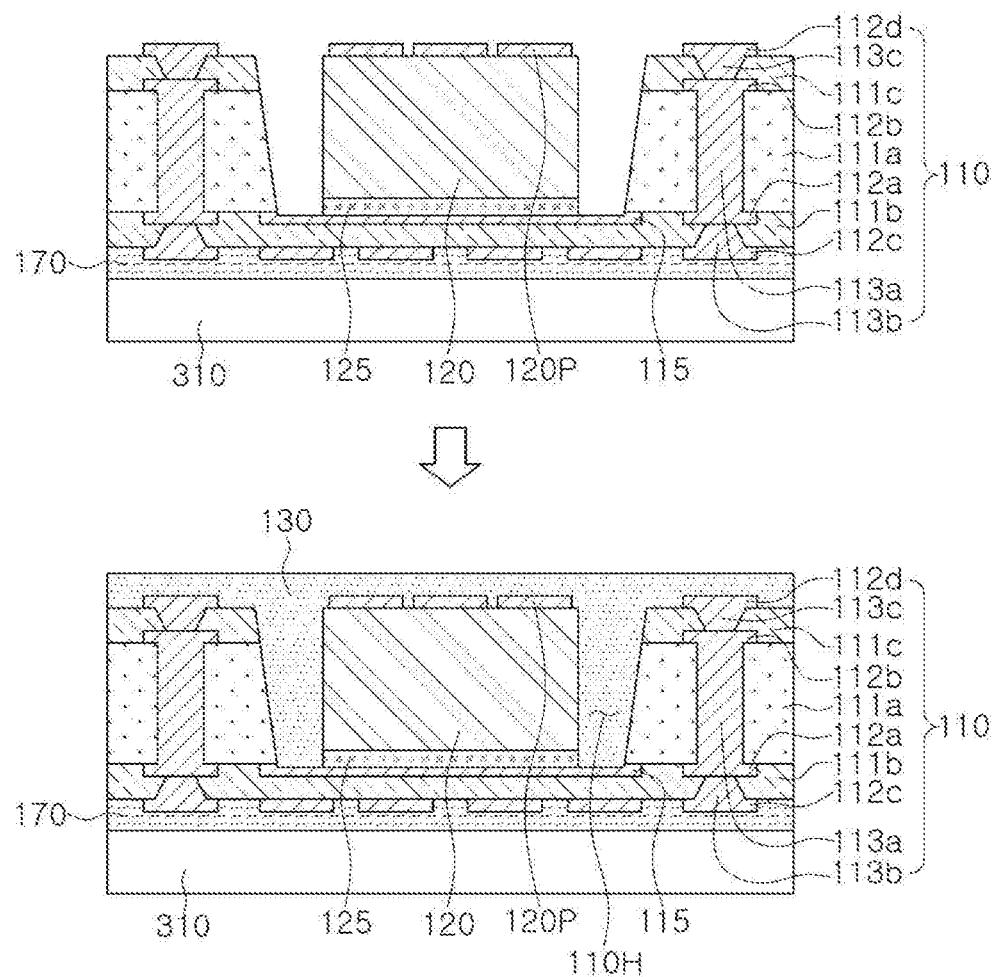

Referring to FIG. 8, the electronic component 120 is attached to the stopper layer 115 in the cavity 110H in the face-up form using the adhesive 125. The first build-up insulating layer 130 is then formed by laminating an ABF, or the like.

Figure 9:
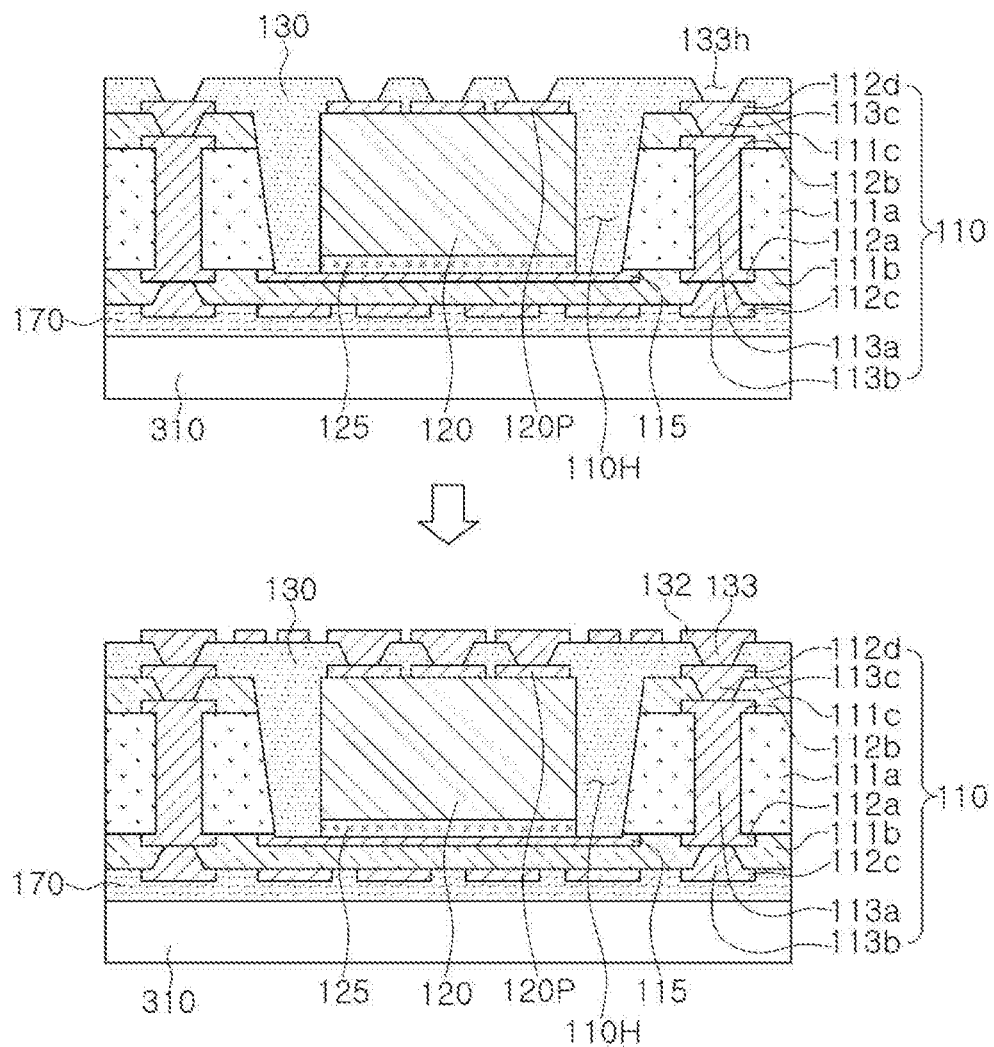

Referring to FIG. 9, the via hole 133h is formed by laser processing or the like. The first build-up wiring layer 132 and the first build-up via layer 133 are then formed in a plating process.

Figure 10:
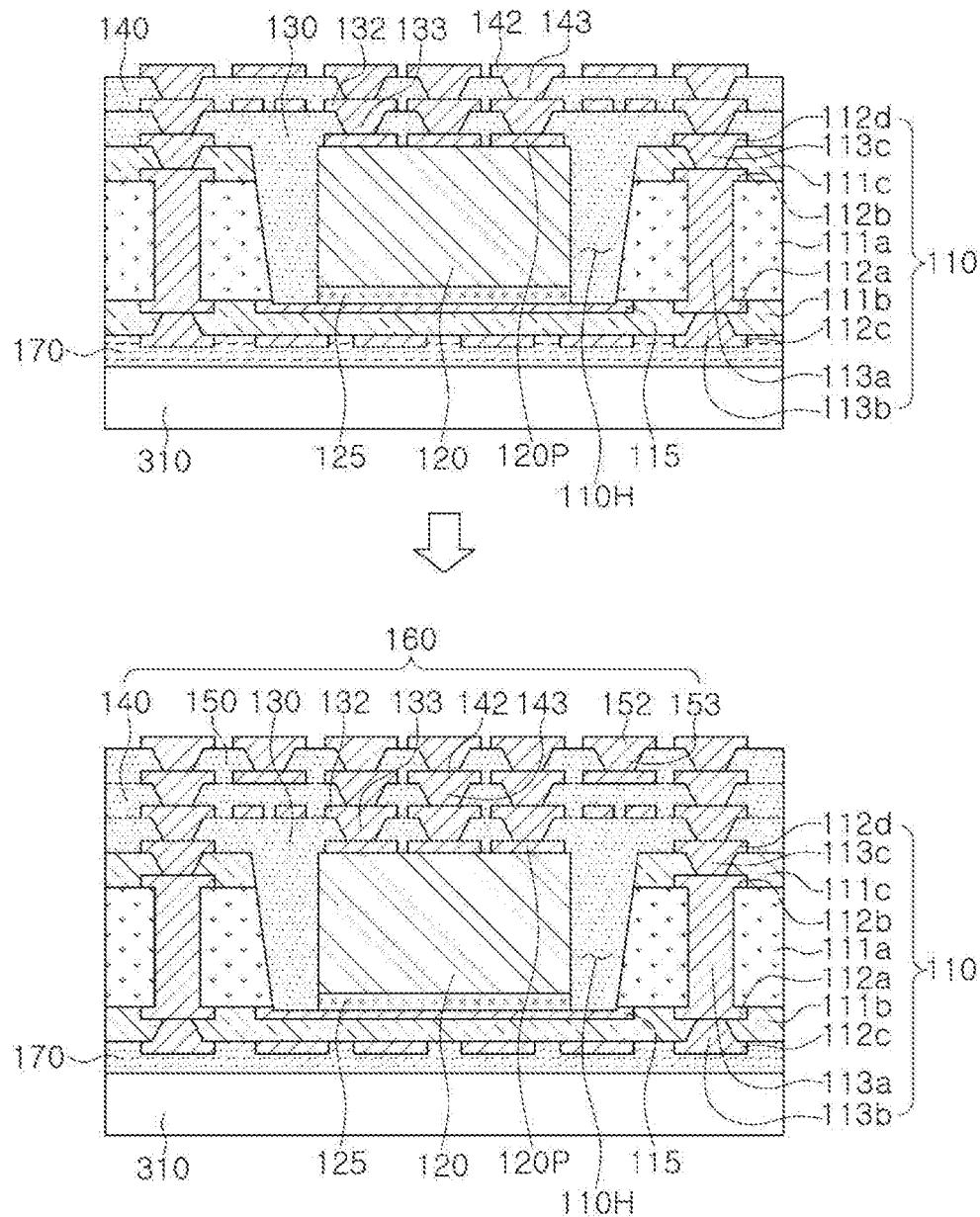

Referring to FIG. 10, the second build-up insulating layer 140, the second build-up wiring layer 142, and the second build-up via layer 143 are formed in a similar manner. The third build-up insulating layer 150, the third build-up wiring layer 152, and the third build-up via layer 153 are then formed in a similar manner. The build-up structure 160 is formed through a series of processes.

Figure 11:
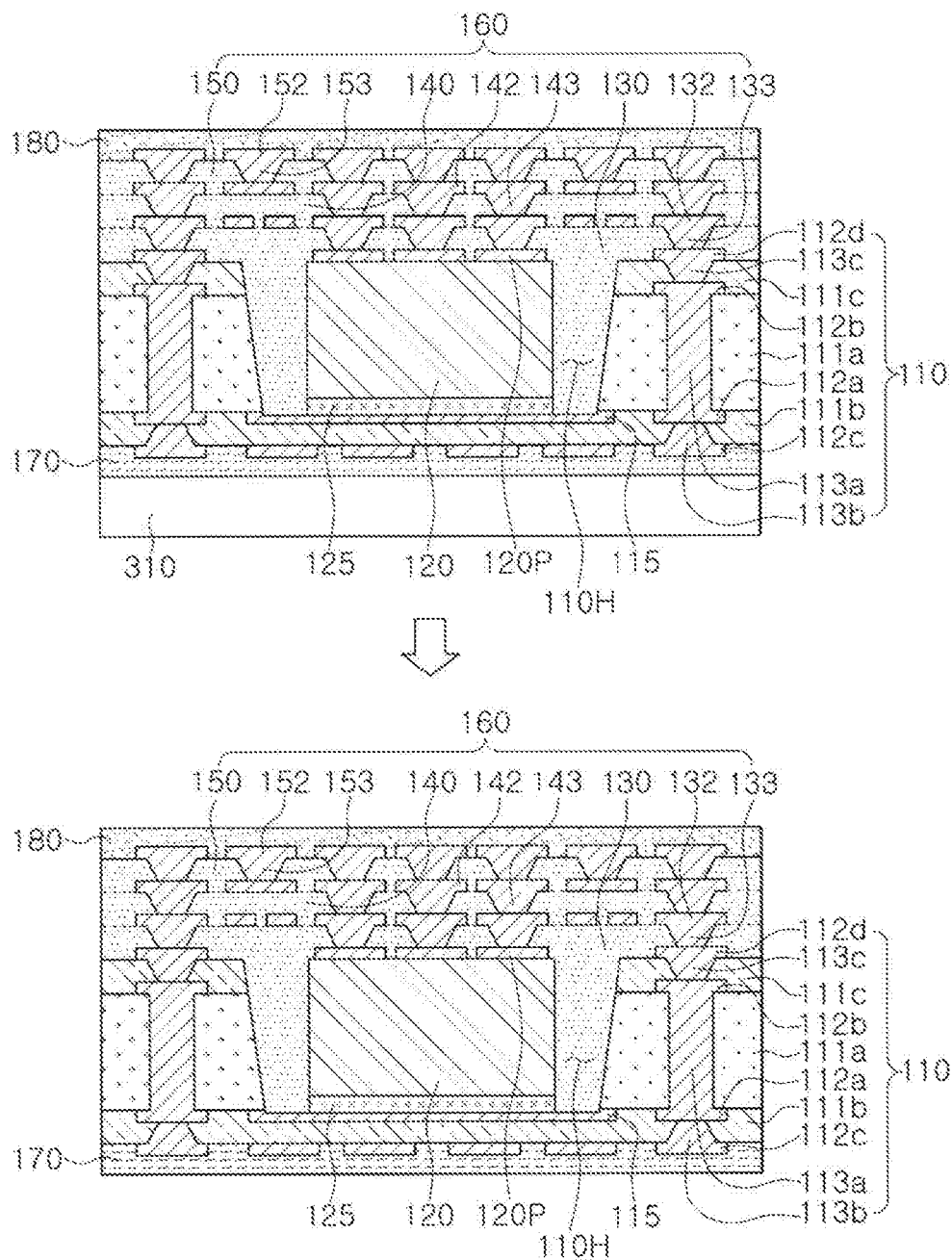

Referring to FIG. 11, the second passivation layer 180 is formed on the upper side of the build-up structure 160 by applying and curing an SR. The detach carrier film 310 is then removed. As necessary, the above-described first and second openings may be formed in the first and second passivation layers 170 and 180. In addition, as necessary, the first and second electrical connection metal bumps 190 and 220 may be formed to mount the surface-mounted component 210.

The above-described substrate 110 having an electronic component embedded therein substrate 100 may be manufactured through a series of processes. Other contents are the same as described above, and detailed descriptions thereof will be omitted.

As described above, a substrate having an electronic component embedded therein, which may control warpage even if having an asymmetrical structure, may be provided.

In addition, a substrate having an electronic component embedded therein, which may be modularized and miniaturized in the form of a system-in-package (SiP), may be provided.

In the example embodiments, the terms "side region," "side surface," and the like, may be used to refer to a surface formed taken in right/left directions, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The notion that an element is disposed on a side region, an upper side, an upper region, or a lower resin may include the configuration in which the element is directly in contact with an element configured as a reference in respective directions, and the configuration in which the element is not directly in contact with the reference element. The terms may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

While example embodiments have been shown and described above, it will be apparent to those skilled in the art that modifications and variations could be made without departing from the scope of the present disclosure as defined by the appended claims.

What is claimed is:

1. A substrate having an electronic component embedded therein, comprising:
    a core structure including a first insulating body and a plurality of first wiring layers, each being disposed on or in the first insulating body, and having a cavity penetrating through a portion of the first insulating body in a direction from a first surface of the first insulating body toward a second surface of the first insulating body, opposing the first surface,
    an electronic component embedded in the cavity,
    a build-up structure including a second insulating body, covering at least a portion of each of the core structure and the electronic component and disposed in a portion of the cavity, and one or more second wiring layers, each of the one or more second wiring layers being disposed on or in the second insulating body,
    a first passivation layer disposed on a side of the core structure opposing a side of the core structure on which the build-up structure is disposed, and
    a second passivation layer disposed on a side of the build-up structure opposing a side of the build-up structure on which the core structure is disposed,
    wherein the first and second passivation layers include different types of materials.

2. The substrate having an electronic component embedded therein of claim 1, wherein the material of the first passivation layer has a coefficient of thermal expansion (CTE) higher than a CTE of the material of the second passivation layer.

3. The substrate having an electronic component embedded therein of claim 2, wherein a material of the first insulating body has a CTE lower than a CTE of a material of the second insulating body.

4. The substrate having an electronic component embedded therein of claim 2, wherein a material of a body of the electronic component has a CTE lower than the CTE of the material of the second insulating body.

5. The substrate having an electronic component embedded therein of claim 1, wherein a center line of the substrate having an electronic component embedded therein is disposed on a level between the first surface and the second surface of the first insulating body based on a thickness direction of the first insulating body, and
    the number of the plurality of first wiring layers is greater than the number of the one or more second wiring layers.

6. The substrate having an electronic component embedded therein of claim 1, wherein the cavity has a stopper layer as a bottom surface of the cavity, and
    the stopper layer is disposed on the same level as one of the plurality of first wiring layers.

7. The substrate having an electronic component embedded therein of claim 6, wherein the electronic component has an active surface, on which a connection pad is disposed, and an inactive surface opposing the active surface and is disposed such that the inactive surface is attached to the stopper layer.

8. The substrate having an electronic component embedded therein of claim 6, wherein the stopper layer has a first region, exposed from the first insulating body by the cavity, and a second region surrounding the first region and covered with the first insulating body, and
    the first region has a thickness less than a thickness of the second region.

9. The substrate having an electronic component embedded therein of claim 1, wherein the core structure includes a first core insulating layer, a first core wiring layer disposed on one side of the first core insulating layer, a stopper layer disposed on one side of the first core insulating layer, a second core wiring layer disposed on the other side of the first core insulating layer, a second core insulating layer disposed on one side of the first core insulating layer and covering at least a portion of each of the first core insulating layer and the stopper layer, a third core wiring layer disposed on the second core insulating layer, a third core insulating layer disposed on the other side of the first core insulating layer and covering at least a portion of the second core wiring layer, and a fourth core wiring layer disposed on the third core insulating layer,
    the first core insulating layer has a thickness greater than a thickness of each of the second and third core insulating layers,
    the first insulating body includes the first to third core insulating layers, and
    the plurality of first wiring layers include the first to fourth core wiring layers.

10. The substrate having an electronic component embedded therein of claim. 9, wherein the core structure further includes a first core via layer penetrating through the first core insulating layer and connecting the first and second core wiring layers to each other, a second core via layer penetrating through the second core insulating layer and connecting the first and third core wiring layers to each other, and a third core via layer penetrating through the third core insulating layer and connecting the second and fourth core wiring layers to each other, and
    the second and third core via layers have profiles tapered in directions opposing each other.

11. The substrate having an electronic component embedded therein of claim 9, wherein the build-up structure includes a first build-up insulating layer, covering at least a portion of each of the first core structure and the electronic component and disposed in at least a portion of the cavity, and a first build-up wiring layer disposed on the first build-up insulating layer,
    the second insulating body includes the first build-up insulating layer, and
    the one or more second wiring layers include the first build-up wiring layer.

12. The substrate having an electronic component embedded therein of claim 11, wherein the build-up structure further includes a second build-up insulating layer disposed on the first build-up insulating layer and covering at least a portion of the first build-up wiring layer, a second build-up wiring layer disposed on the second build-up insulating layer, a third build-up insulating layer disposed on the second build-up insulating layer and covering at least a portion of the second build-up wiring layer, and a third build-up wiring flayer disposed on the third build-up insulating layer, the second insulating body further includes the second and third build-up insulating layer, and the one or more second wiring layers further include the second and third build-up wiring layers.

13. The substrate having an electronic component embedded therein of claim 12, wherein the build-up structure further includes a first build-up via layer penetrating through the first build-up insulating layer and connecting the first build-up wiring layer to each of the electronic component and the fourth core wiring layer, a second build-up via layer penetrating through the second build-up insulating layer and connecting the first and second build-up wiring layers to each other, and a third build-up via layer penetrating through the third build-up insulating layer and connecting the second and third build-up wiring layers to each other, and each of the first to third build-up via layers has a profile tapered such that a width of a cross section is decreased in a direction from the build-up structure toward the core structure.

14. The substrate having an electronic component embedded therein of claim 1, wherein the first passivation layer has a plurality of first openings, each exposing at least a portion of one of the plurality of first wiring layers, and a plurality of electrical connection metal bumps, each being connected to the exposed at least a portion of the one of the first wiring layers, are disposed on the plurality of first openings, respectively.

15. The substrate having an electronic component embedded therein of claim 14, wherein the second passivation layer has a plurality of second openings, each exposing at least a portion of one of the one or more second wiring layers, a plurality of second electrical connection metal bumps, each being connected to the exposed at least a portion of the one of the one or more second wiring layers, are disposed on the plurality of second openings, respectively, and one or more surface-mounted components are mounted on the second passivation layer through the plurality of second electrical connection metal bumps.

16. The substrate having an electronic component embedded therein of claim 1, wherein the first passivation layer and the second insulating body are made of the same material.

17. The substrate having an electronic component embedded therein of claim 1, wherein the second passivation includes a solder resist.

18. The substrate having an electronic component embedded therein of claim 1, wherein a distance from the first passivation layer to the core structure is less than a distance from the second passivation layer to the core structure.

19. The substrate having an electronic component embedded therein of claim 1, wherein the build-up structure is disposed only between the core structure and the second passivation layer.

* * * * *